(12) United States Patent
Lambert

(10) Patent No.: US 6,227,581 B1
(45) Date of Patent: May 8, 2001

(54) LATCH ASSEMBLY

(75) Inventor: Anthony Lambert, Surrey (GB)

(73) Assignee: McKechnie UK Limited, Guilford (GB)

( * ) Notice: Subject to any disclaimer, the term of this patent is extended or adjusted under 35 U.S.C. 154(b) by 0 days.

(21) Appl. No.: 09/657,086

(22) Filed: Sep. 7, 2000

Related U.S. Application Data

(63) Continuation-in-part of application No. 09/332,612, filed on Jun. 14, 1999, now Pat. No. 6,168,214.

(51) Int. Cl.[7] .................................................. E05C 3/06
(52) U.S. Cl. ....................... 292/200; 292/100; 292/336.3; 292/DIG. 49
(58) Field of Search ............................. 292/200, 97, 196, 292/223, DIG. 49, 336.3, 113, 100

(56) References Cited

U.S. PATENT DOCUMENTS

| | | |
|---|---|---|
| 567,621 | 9/1896 | Smith . |
| 960,386 | 6/1910 | Obert . |
| 3,446,524 | 5/1969 | Barry . |
| 4,003,614 | 1/1977 | Geer et al. . |
| 4,230,351 | 10/1980 | Bisbing . |
| 4,982,303 | 1/1991 | Krenz . |
| 5,045,960 | 9/1991 | Eding . |
| 5,435,615 | 7/1995 | Schmitz . |
| 5,706,681 | 1/1998 | Gorokhovsky . |
| 5,975,556 | 11/1999 | Lehmann . |

FOREIGN PATENT DOCUMENTS

| | | |
|---|---|---|
| 35693 | 10/1929 | (FR) . |
| 793975 | 4/1958 | (GB) . |

*Primary Examiner*—Teri Pham Luu
(74) *Attorney, Agent, or Firm*—Hoffman & Baron, LLP

(57) ABSTRACT

A latch assembly for latching two components comprising a support member arranged co be attached, in use, to a first component to be latched. A lever member is pivotally attached to the support member at a first pivot point, and an engaging member is pivotally attached to the support member at a second pivot point. The engaging member is arranged to be moved, by movement of the lever member, from a position in which it urges a second component out of engagement with the first component to a position in which it engages with a second component to be latched to draw the second component into engagement with the first component and latch the components.

5 Claims, 4 Drawing Sheets

Fig. 1
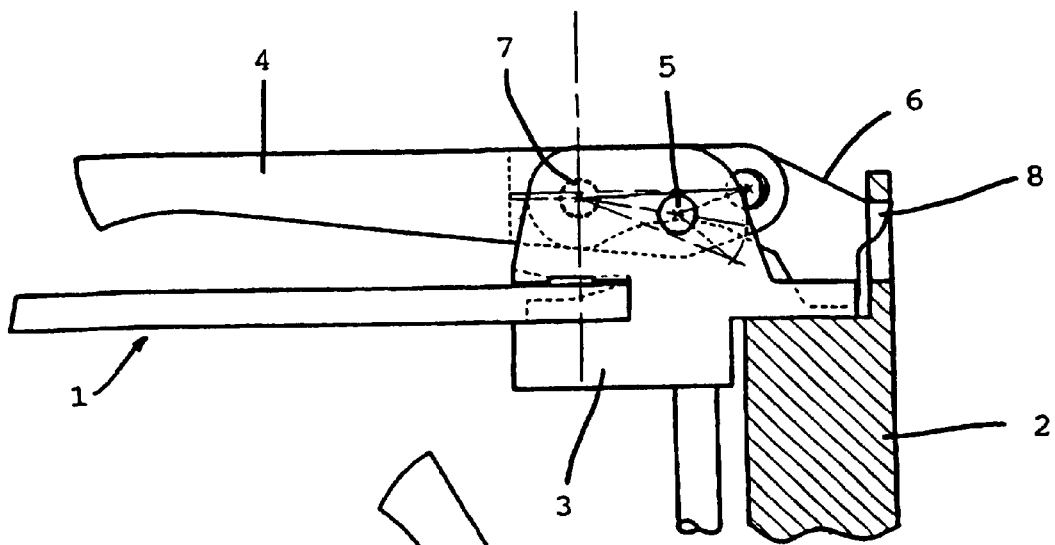
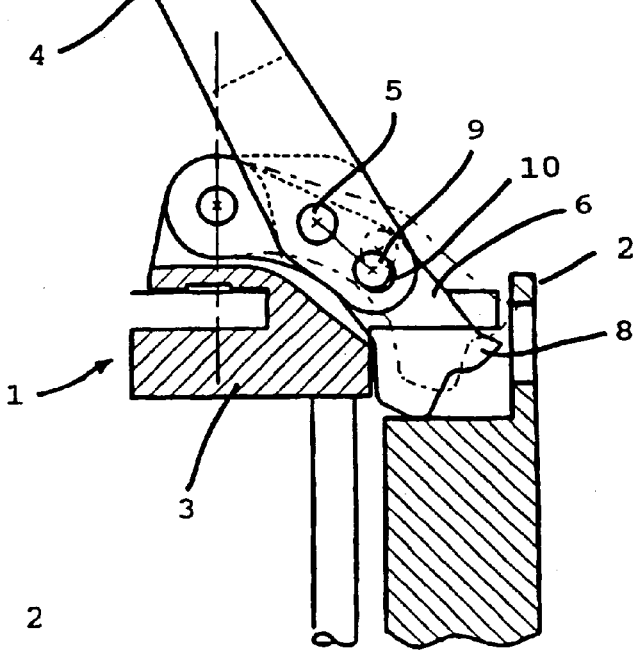
Fig. 2

Fig. 4A
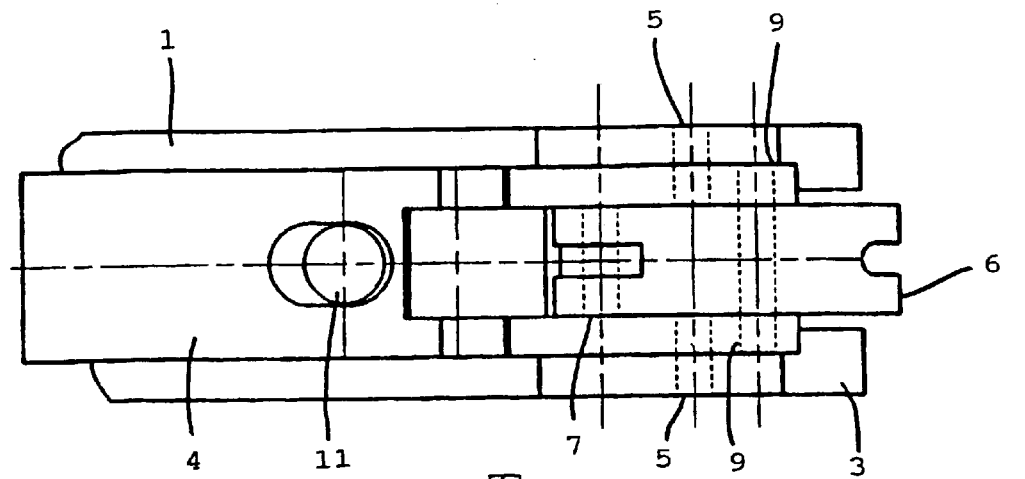
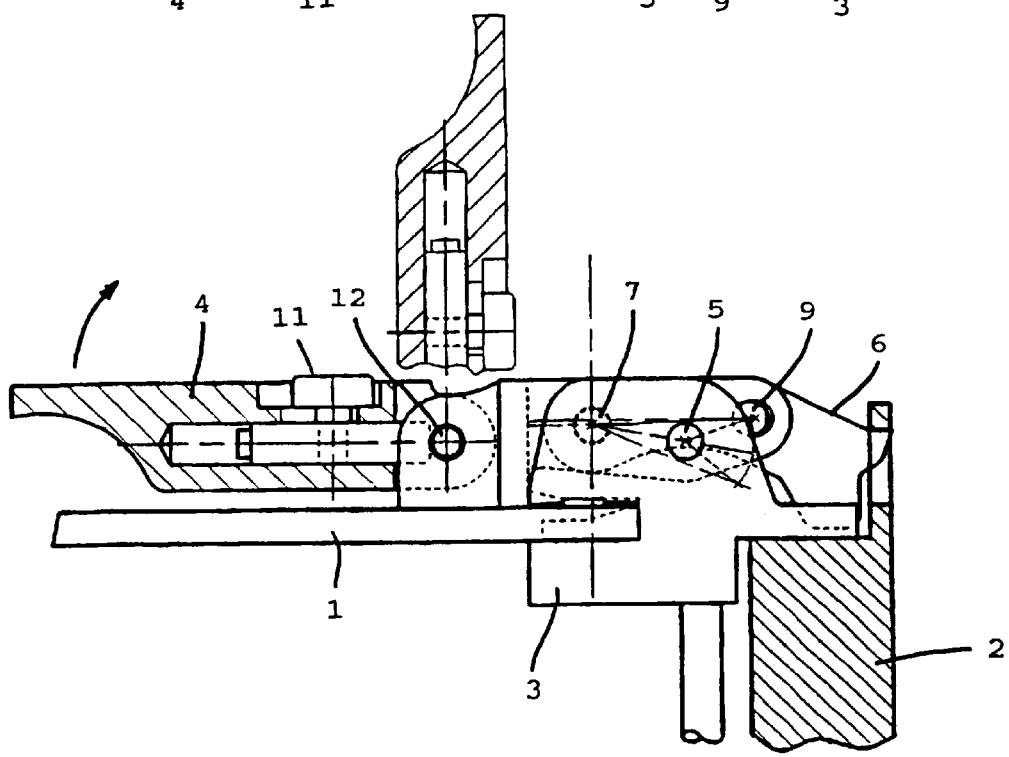
Fig. 4B

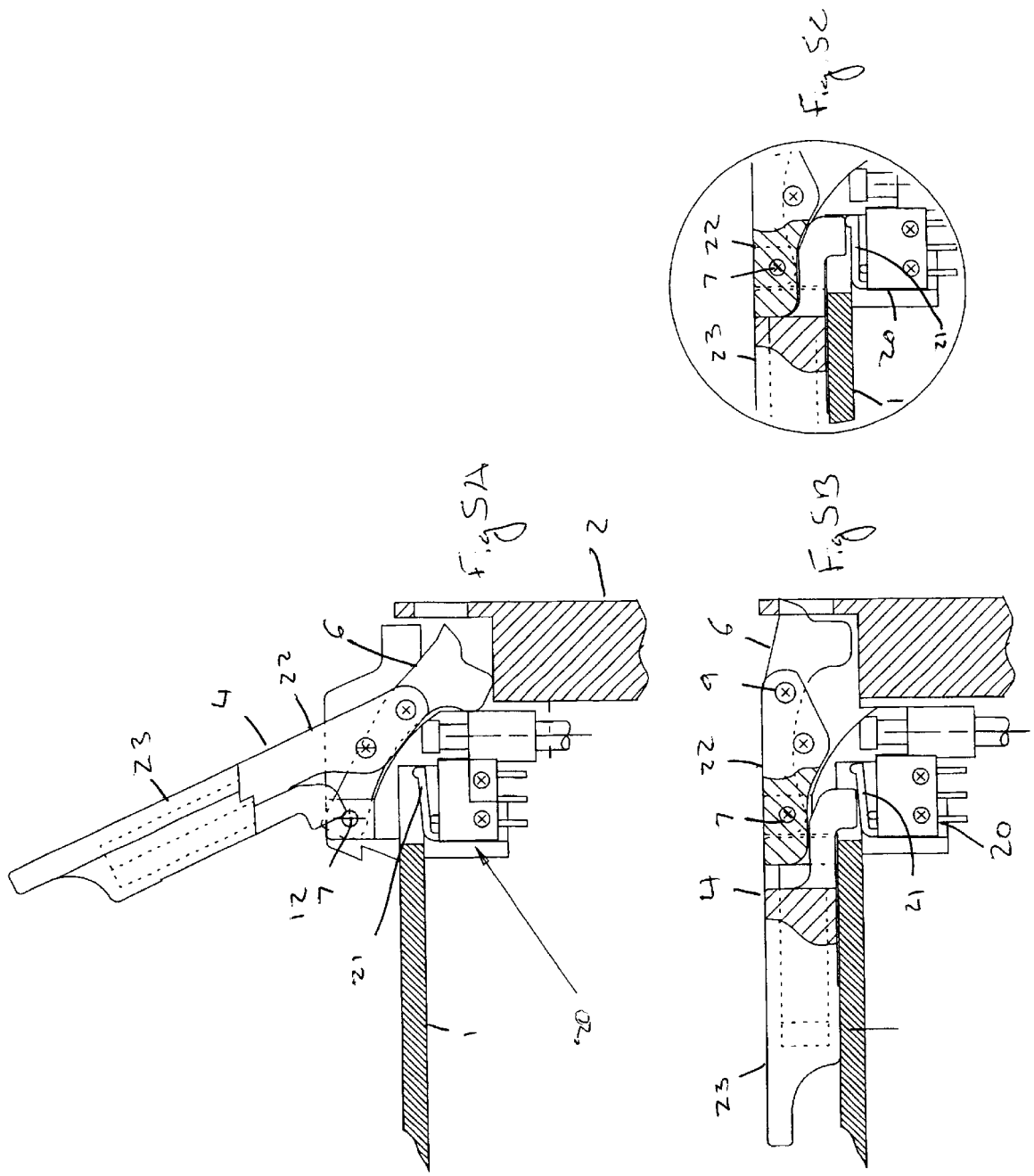

LATCH ASSEMBLY

This application is a continuation-in-part of Ser. No. 09/332,612 filed on Jun. 14, 1999, issued as U.S. Pat. No. 6,168,214.

BACKGROUND OF THE INVENTION

There are many applications in which it is required to latch two components into engagement with one another. In many such applications it is difficult for a user carrying out the latching to assert sufficient force to ensure sufficient engagement or dis-engagement of the two components for the required purpose.

A good example of such a situation is the latching of an electrical circuit board to a housing, in which it is required that, when the board and housing are in engagement, the engagement be such that good electrical contact is made between the board and the housing. Given that, in many situations, such components are in a confined region with restricted access, it is difficult for a user to ensure good engagement unless force is applied to sections of the board or housing that are not designed to withstand such force.

Furthermore, once such components are in engagement, it is often very difficult to remove them from engagement with one another without, again, requiring force to be applied to regions that are not designed to receive such force.

SUMMARY OF THE INVENTION

According to the present invention there is provided a latch assembly for latching two components, the assembly comprising:

a support member arranged to latchably arrange, in use, to a first component;

a level member pivotally attached to the support member at a first pivot point; and an engaging member being pivotally attached to the support member at a second pivot point and arranged to be moved, by movement of the lever member, from a position in which the engaging surface urges a second component out of engagement with the first component to a position in which the engaging surface engages with the second component to be latched to draw the second component into engagement with the first and latch the components, wherein the first pivot point is closer than the second pivot point to the engaging surface, and the lever member comprises an enabling member slidably attached thereto and arranged to slide, where the assembly is in a latching position to lock the assembly and actuate a switch.

The engaging member may have a pin formed therein, the pin engaging, in use, with a slot on the lever member.

If a slot and pin arrangement is provided the position of the slot and pin relative to the first and second pivot points may be selected such that, when the latch assembly is in a latched position, the latch is biased to remain in that position.

The first pivot point may be closer than the second pivot point to the engaging surface of the engaging member to provide good mechanical advantage.

The lever member may be arranged so that it can be folded into a storage position.

One example of the present invention will now be described with reference to the accompanying drawings.

BRIEF DESCRIPTION OF THE DRAWINGS

FIG. 1 is a side view of a latch assembly in an engaged and latched position;

FIG. 2 is a side view of the latch assembly of FIG. 1 in an unlatched dis-engaging position;

FIGS. 4A and 4B are plan and side views of a further latch assembly in an engaged latched position; and FIGS. 5A to 5C are side cross-sectional views of a latch assembly according to invention, in unlatched, latched and latched and enabled positions.

DETAILED DESCRIPTION OF THE INVENTION

Figure 3:
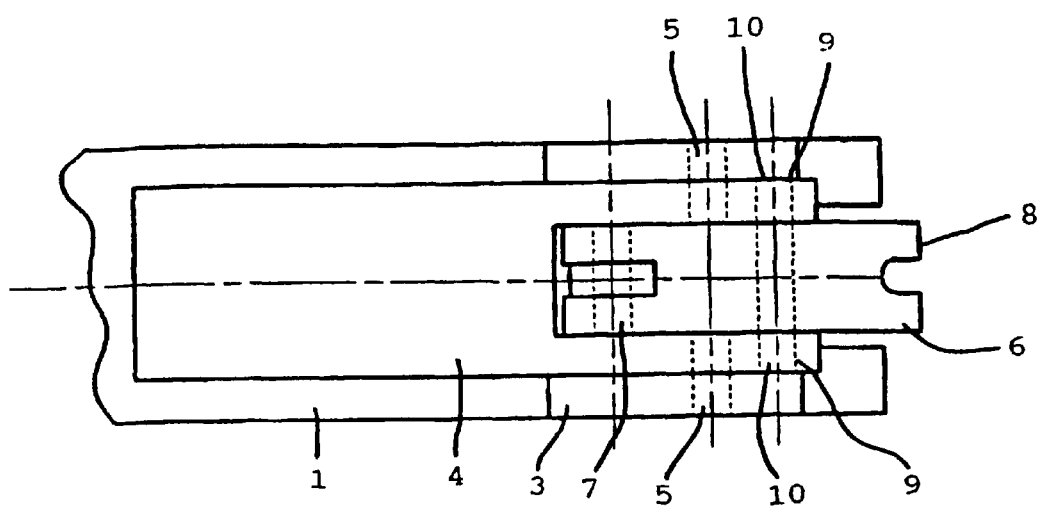
FIG. 3 is a plan view of the latch assembly of FIG. 1.

Referring to FIG. 1, a support block 3 for a latch assembly is attached to a first component 1 which is to be latched to a second component 2. Pivotally supported on the support block 3 is a lever member. The lever member 4 is pivotally supported upon the support block 3 by pins 5. Also pivotally attached to the support block 3 is an engaging member 6. The engaging member 6 is pivotally attached to the support block 3 by a pin 7. An engaging portion 8 is formed on one end of the engaging member 6. A slot or slots 10 are formed in the lever member 4 and a pin or pins 9, attached to engaging member 6, are retained therein. Alternatively, the slot or slots 10 may be formed in the engaging member and the pin or pins 9 may be attached to the lever member 4.

In operation, the latch assembly is initially in unlatched position (FIG. 2) and a user pivots the lever member 4. The retaining slots 10 in the lever member 4 pivot the engaging member 6 via the pins 9. The engaging portion 8 of the engaging member 6 engages with the second component 2 to be latched. The second component 2 to be latched is then drawn into engagement with the first component 1 to be latched. The lever member 4 can finally be pivoted no further and is biased into the latch position by the relative positions of the pins 5, 7 and pin and slot arrangement 9,10. When disengaging the two components 1,2 to be latched the lever member 4 is pivoted in the opposite direction and a further section of the engaging portion 8 urges the two components 1,2 out of engagement.

FIG. 4 shows a second example, in which components corresponding to those in the example of FIG. 1 have identical numbering. In this example, the lever member is arranged so that it has a releasable latch 11 formed thereon. The lever member 4 is formed from two components pivotally attached to one another by a pin 12. The releasable latch 11 allows the lever member to be folded around the pin 12 when the releasable latch 11 is activated. This means that, when the latch is in a latched position, the lever member 4 can be moved into a position in which it does not impinge upon anything attached to the surface of the first component 1.

FIG. 5A shows an example of the present invention, in which components corresponding to the latch assemblies shown in the earlier figures are numbered identically. In this case, a microswitch 20 is also incorporated into the latch assembly and has an actuating member 21. In addition, the lever member 4 is formed from two components 22, 23. Component 22 acts in a manner according to the examples described previously, and component 23 is slidably disposed thereon. FIG. 5B shows the latch assembly of FIG. 5A in a latch position, in which the component 23 of the lever member 4 is in an extended position. In this position the two components 1,2 to be latched are latched together, but any circuitry contained thereon is not enabled, because the microswitch 20 prevents this as it is not actuated. FIG. 5C shows the latch assembly of FIGS. 5A and 5B once the component 23 of the lever member 4 is slid into an enabling position. In this position it locks the assembly such that it cannot be disengaged and also engages with the actuating member 21 of the microswitch 20 enabling the circuitry to which the microswitch 20 is connected. To un-latch the assembly the component 23 of the lever member 4 is slid back to an extended position and the latch assembly can be moved into the unlatched position in FIG. 5A.

It will also be appreciated that the device of FIGS. 5A to 5C does not have the slot 10 of earlier examples. In this case biassing is achieved not through the provision of a slot and pin arrangement 9, 10, but by inherent flexibility in the materials employed to construct the device. This can enable additional biassing without the need to introduce any further spring component.

The present invention, whilst enabling strong and reliable latching of two components, also allows for simple disengagement of the two components when required. Furthermore, it has a minimum number of simple components, making it cheap and easy to manufacture. In addition, it has a low profile which means that a series of latched components can be stacked one upon another in close relationship, and provides simple error-free enabling of circuitry once latching has occurred.

What is claimed is:

1. A latch assembly for latching two components, the assembly comprising:

a support member arranged to latchably arrange, engage in use, to a first component;

a lever member pivotally attached to the support member at a first pivot point; and an engaging member having an engaging surface, the engaging member being pivotally attached to the support member at a second pivot point and arranged to be moved, by movement of the lever member, from a pesicion position in which the engaging surface urges a second component out of engagement with the first component to a position in which the engaging surface engages with the second component to be latched to draw the second component into engagement with the first component and latch the components, wherein the first pivot point is closer than the second pivot point to the engaging surface, and the lever member comprises an enabling member slidably attached thereto and arranged to slide, when the assembly is in a latching position, to lock the assembly and actuate a switch.

2. An assembly according to claim 1, wherein the engaging member has a pin formed therein, the pin engaging, in use, with a slot on the lever member.

3. An assembly according to claim 2, wherein the position of the slot and pin relative to the first and second pivot points may be selected such that, when the latch assembly is in a latched position, the latch is biased to remain in that position.

4. An assembly according to claim 1, wherein the engaging member has a slot formed therein, the slot engaging, in use, with a pin on the lever member.

5. An assembly according to claim 4, wherein the position of the slot and pin relative to the first and second pivot points may be selected such that, when the latch assembly is in a latched position, the latch is biased to remain in that position.

\* \* \* \* \*